United States Patent
Chiou et al.

(10) Patent No.: US 10,221,062 B2
(45) Date of Patent: Mar. 5, 2019

(54) CAVITY WITH SILICON ON INSULATOR MEMS PRESSURE SENSING DEVICE WITH AN EXTENDED SHALLOW CROSS-SHAPED CAVITY

(71) Applicant: Continental Automotive Systems, Inc., Auburn Hills, MI (US)

(72) Inventors: Jen-Huang Albert Chiou, Libertyville, IL (US); Shiuh-Hui Steven Chen, Lake Zurich, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 15/283,777

(22) Filed: Oct. 3, 2016

(65) Prior Publication Data

US 2018/0093881 A1   Apr. 5, 2018

(51) Int. Cl.
| | | |
|---|---|---|
| *B81C 1/00* | (2006.01) | |
| *B81B 3/00* | (2006.01) | |
| *G01L 9/00* | (2006.01) | |
| *G01L 9/06* | (2006.01) | |
| *H01C 10/10* | (2006.01) | |

(Continued)

(52) U.S. Cl.
CPC ........ *B81B 3/0059* (2013.01); *B81C 1/00158* (2013.01); *G01L 9/06* (2013.01); *H01C 10/10* (2013.01); *H01C 10/20* (2013.01); *B81B 2201/0264* (2013.01);
(Continued)

(58) Field of Classification Search
CPC ....... H01L 2924/14; H01L 2924/15153; H01L 2924/10253; H01L 2924/1461; H01L 2924/00; H01L 2224/05552; H01L 2224/80; H01L 21/76264; H01L 21/764; H01L 23/538; H01L 25/0652; H01L 2224/80001; H01L 21/44; H01L 21/46; H01L 21/465; H01L 23/5381; B81B 3/0059; B81B 2203/0127; B81B 2201/0264; B81B 2203/0315;
(Continued)

(56) References Cited

U.S. PATENT DOCUMENTS

| | | |
|---|---|---|
| 4,236,137 A | 11/1980 | Kurtz et al. |
| 5,178,016 A | 1/1993 | Dauenhauer et al. |

(Continued)

OTHER PUBLICATIONS

MTMicrosystems "MEMS Pressure Sensor Dies", Catalogue, p. 7.
(Continued)

*Primary Examiner* — Natalia A Gondarenko

(57) ABSTRACT

An improved microelectromechanical system (MEMS) pressure sensing device has an extended shallow polygon cavity on a top side of a silicon supporting substrate. A buried silicon dioxide layer is formed between the top side of the supporting substrate and a bottom side of a device layer. Piezoresistors and bond pads are formed and located on a top side of the device layer and produce measureable voltage changes responsive to a fluid pressure applied to the device layer. The purpose of the extend shallow polygon cavity is to improve the sensitivity or increase the span while keep a low pressure nonlinearity during shrinking the die size of the MEMS pressure sensing device die with corner metal bond pads having a keep-out distance to prevent a wire bonder from breaking the thin diaphragm.

13 Claims, 15 Drawing Sheets

(51) Int. Cl.
*H01C 10/20* (2006.01)
*H01L 21/00* (2006.01)

(52) U.S. Cl.
CPC .................. *B81B 2203/0127* (2013.01); *B81B 2203/0315* (2013.01); *B81C 2201/013* (2013.01); *B81C 2203/036* (2013.01)

(58) Field of Classification Search
CPC .......... B81C 1/00158; B81C 2201/013; B81C 2203/036; G01L 9/06; H01C 10/20; H01C 10/10
USPC ......... 257/415, 417, 470, E29.324, E29.347, 257/E21.231, E21.502, E21.002; 438/29, 438/46, 50–57, 482, 478, 19, 760
See application file for complete search history.

(56) References Cited

U.S. PATENT DOCUMENTS

| | | | |
|---|---|---|---|
| 5,759,870 A * | 6/1998 | Yun | B81C 1/00047 438/445 |
| 6,093,579 A | 1/2000 | Wang et al. | |
| 7,111,518 B1 | 9/2006 | Allen et al. | |
| 7,487,681 B1 | 2/2009 | Allen | |
| 8,881,596 B2 | 11/2014 | Chiou et al. | |
| 9,725,312 B1 * | 8/2017 | Hsin | B81C 1/00357 |
| 2009/0159997 A1 * | 6/2009 | Okudo | B81C 1/00269 257/415 |
| 2012/0125114 A1 * | 5/2012 | Stewart | G01L 9/0054 73/721 |
| 2012/0205653 A1 * | 8/2012 | Nishikage | G01L 9/0045 257/49 |
| 2013/0205908 A1 * | 8/2013 | Hsu | G01L 9/0047 73/725 |
| 2015/0210540 A1 * | 7/2015 | Sadaka | B81C 1/00238 257/414 |
| 2015/0330856 A1 | 11/2015 | Chiou et al. | |

OTHER PUBLICATIONS

Search Report dated Feb. 16, 2017, from corresponding GB Patent Application No. GB1617888.1.
Zhang et al., "A monolithic integration multifunction MEMS sensor based on cavity SOI wafer", IEEE sensors 2014, pp. 1952-1955, IEEE.

* cited by examiner

CAVITY WITH SILICON ON INSULATOR MEMS PRESSURE SENSING DEVICE WITH AN EXTENDED SHALLOW CROSS-SHAPED CAVITY

BACKGROUND

Microelectromechanical system (MEMS) pressure sensing devices are well known. For instance, U.S. Pat. No. 4,236,137 to Kurtz et al. discloses a semiconductor pressure transducer. U.S. Pat. Nos. 5,178,016 and 6,093,579 also disclose solid state pressure sensors. U.S. Pat. No. 8,881,596 entitled, "Semiconductor Sensing Device to Minimize Thermal Noise," owned by the Applicant of this application, discloses a MEMS pressure sensing device and is incorporated herein by reference in its entirety.

MEMS pressure sensing devices are known to "suffer" from a pressure nonlinearity or "PNL." PNL is a function of a silicon diaphragm's deflection. The ability of a diaphragm to deflect, however, also determines a MEMS pressure sensing device's ability to detect pressure changes. As diaphragm deflection increases, so does output nonlinearity. See, for example, U.S. pre-grant publication 2015/0330856, entitled, "Pressure Sensor Device with High Sensitivity and High Accuracy," published Nov. 19, 2015, assigned to the same Applicant and incorporated herein by reference in its entirety.

Pressure sensitivity of a MEMS pressure sensing device becomes more problematic as diaphragm size decreases. Smaller diaphragms, and smaller MEMS pressure sensing devices, however, enable manufacturing costs to be reduced for both the MEMS pressure sensing device itself and the packaging for the MEMS pressure sensing device to be placed in. An apparatus and method to shrink the die size of a MEMS pressure sensing device, while increasing sensitivity and decreasing PNL would be an improvement over the prior art.

DETAILED DESCRIPTION

Figure 1:
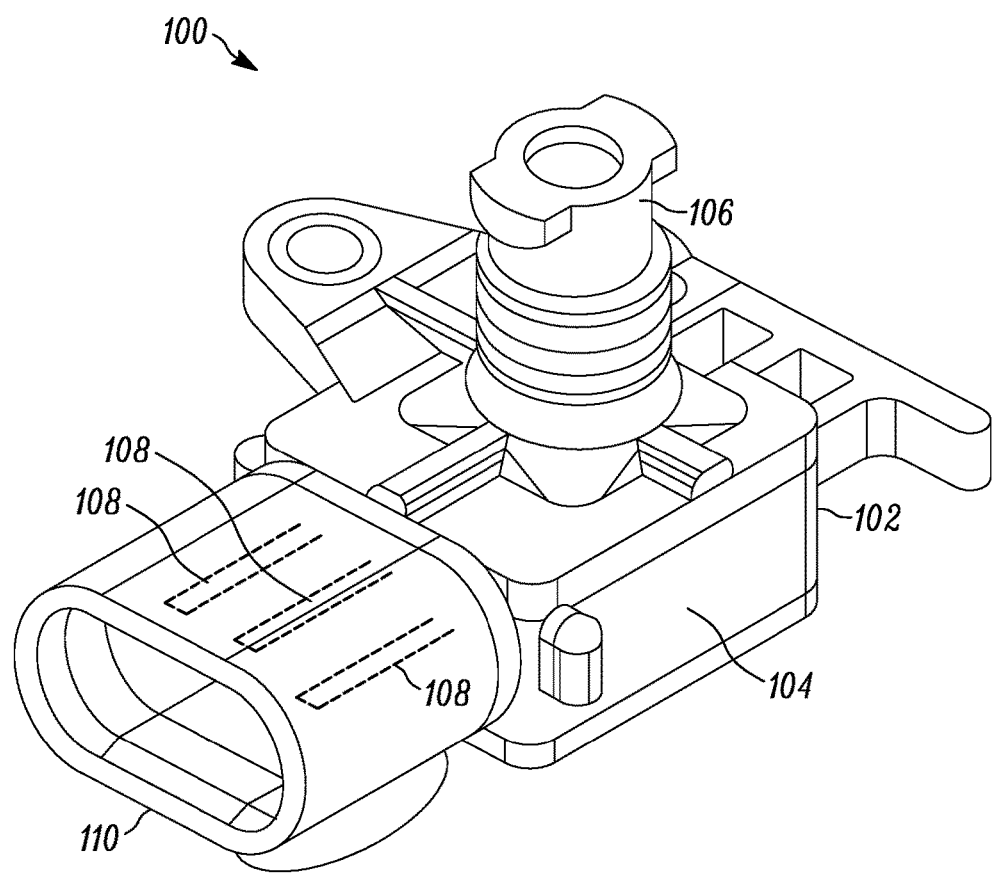
FIG. 1 is a perspective view of a prior art pressure sensor, which incorporates a MEMS pressure sensing device.

FIG. 1 is a perspective view of a prior art pressure sensor 100. The pressure sensor 100 comprises a plastic housing identified generally by reference numeral 102.

Figure 2:
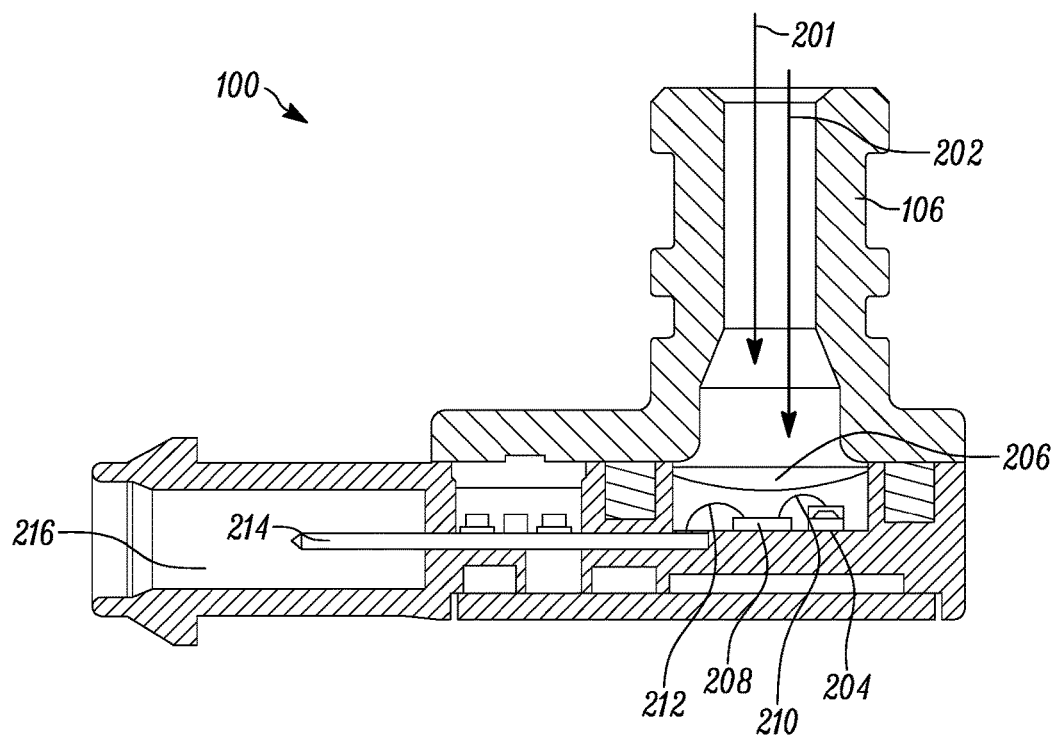
FIG. 2 is a cross-sectional diagram of the pressure sensor depicted in FIG. 1.

The housing 102 has a rectangular-shaped body 104 in which a MEMS pressure sensing device 204 as shown in FIG. 2 is located. Fluid (liquid or gas) pressure is applied to the MEMS pressure sensing device 204 through a port 106 that extends from outside the housing as shown, to a cavity (not shown) inside the housing 102.

The MEMS pressures sensing device 204 in the housing 102 transduces changes in a fluid pressure to a voltage, which is obtained through electrical connectors 108 located inside a generally tubular port or passageway 110 that extends outwardly from the housing 102. Stated another way, pressures applied to a MEMS pressure sensing device 204 inside the housing 102 through the port 106 produces a measurable output voltage at connection terminals 108 located inside an open end of the passageway 110 of the housing 102.

FIG. 2 is a cross-sectional diagram of the pressure sensor 100. Fluid 201 that passes into the port 106 applies a pressure 202 to the MEMS pressure sensing device 204 located inside a pocket 206 inside the housing 102. The pressure 202, and any changes thereof, are detected by a voltage change measured by an application-specific integrated circuit (ASIC) 208 connected to the MEMS pressure sensing device 204 through thin bond wires 210. The electrical signals representing pressure changes are carried from the ASIC 208 by otherbond wires 212, to a pin 214 that extends into a cavity 216 and through which connections can be made to the vehicle.

Figure 3:
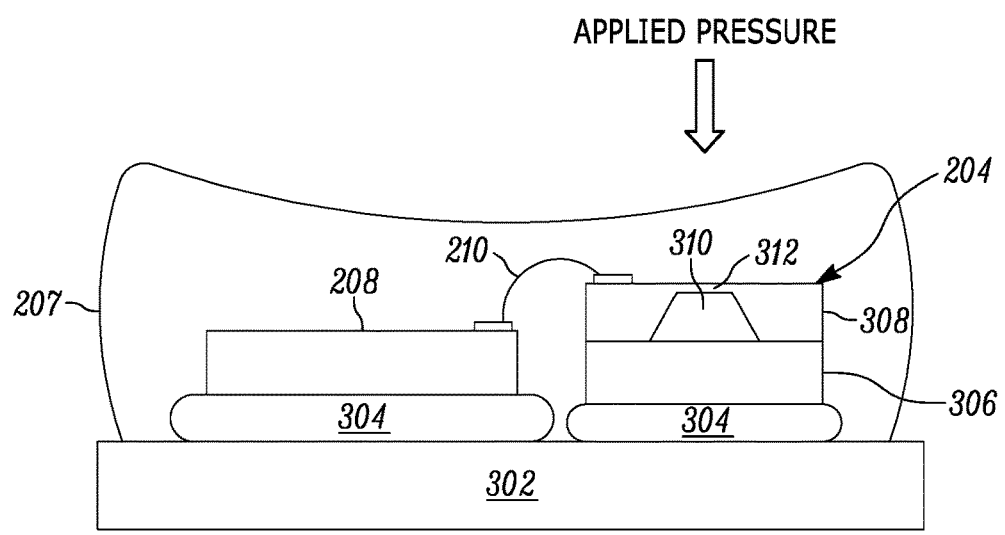
FIG. 3 is a cross-sectional diagram of a MEMS pressure sensing device and an adjacent integrated circuit, inside a cavity of the pressure sensor shown in FIGS. 1 and 2.

FIG. 3 is a "close-up" view of the inside of the pocket 206 showing in greater detail, the MEMS pressure sensing device 204, an adjacent ASIC 208 and interconnections provided by bond wires 210 extending between the MEMS pressure sensing device 204 and the ASIC 208. The MEMS pressure sensing device 204 and the ASIC 208 are attached to a substrate 302, by an adhesive layer 304.

The MEMS pressure sensing device 204 typically comprises a glass substrate 306 on top of which is a silicon substrate 308. The silicon substrate 308 is processed as described in the patent applications listed above (which are incorporated by reference) and anodically bonded to provide an evacuated cavity 310 on top of which is a diaphragm 312.

The diaphragm 312 is "doped" in localized regions using known processes to form piezoresistors, not shown in FIG. 3. The piezoresistors are connected together in a Wheatstone bridge topology. Diaphragm deflections cause the piezoresistors' values to change. When those values change, the voltage output from the Wheatstone bridge they form, changes accordingly.

Figure 4:
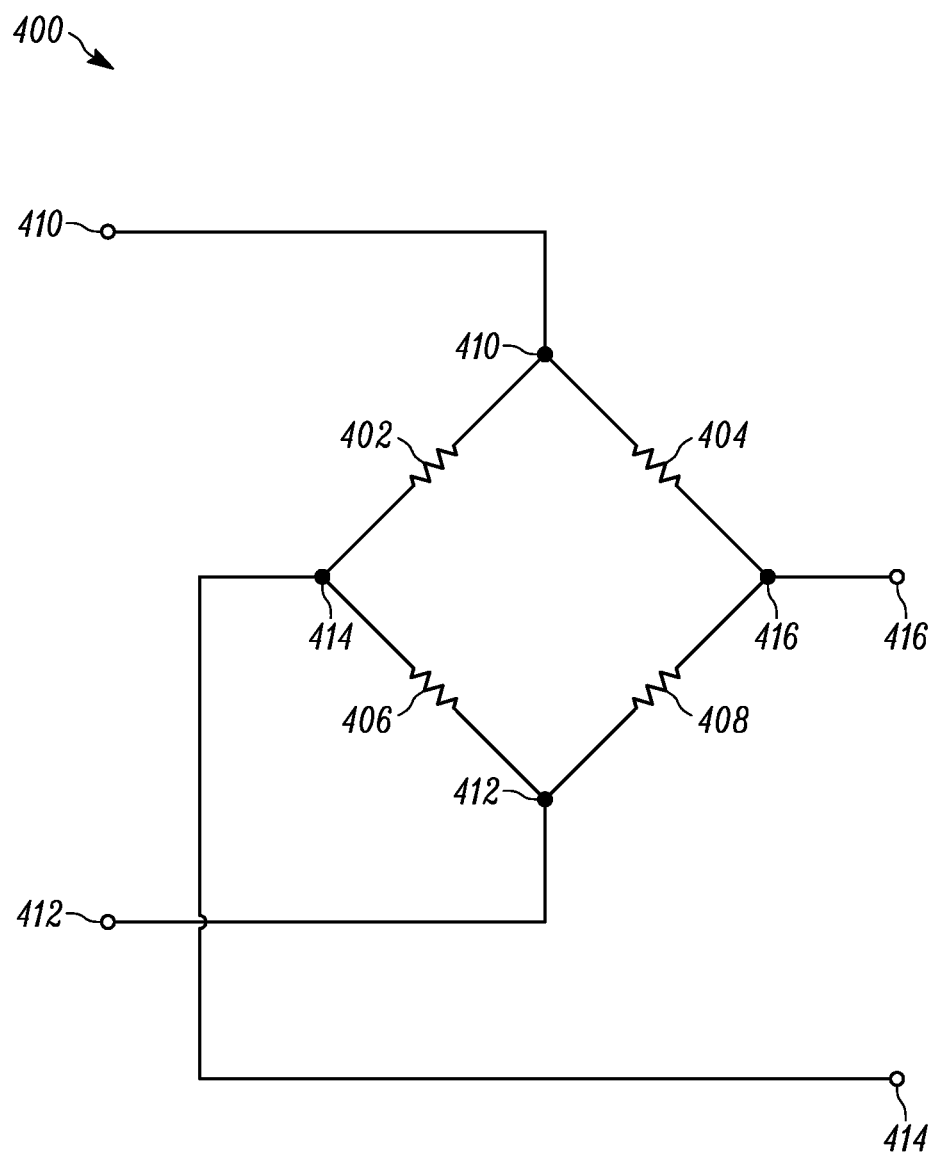
FIG. 4 is a schematic diagram of a Wheatstone bridge circuit.

FIG. 4 depicts a Wheatstone bridge circuit 400, formed of piezoresistors. The circuit 400 comprises four piezoresistors 402, 404, 406 and 408. They are considered herein to be connected end-to-end and to each other as shown.

Two opposing nodes 410 and 412 are considered to be input nodes. An input voltage across the input nodes 410 and 412 can be measured across the other opposing corners or nodes 414 and 416, which are considered to be output nodes.

If the values of any of the resistances of the Wheatstone bridge circuit 400 change, as happens when the physical size of the resistances change with diaphragm deflection, the voltage from the output nodes 414 and 416 will change as well. Changes in the resistances of piezoresistors formed into the diaphragm 312 of a MEMS pressure sensing device will cause an output voltage from the Wheatstone bridge circuit to change accordingly.

Figure 5:
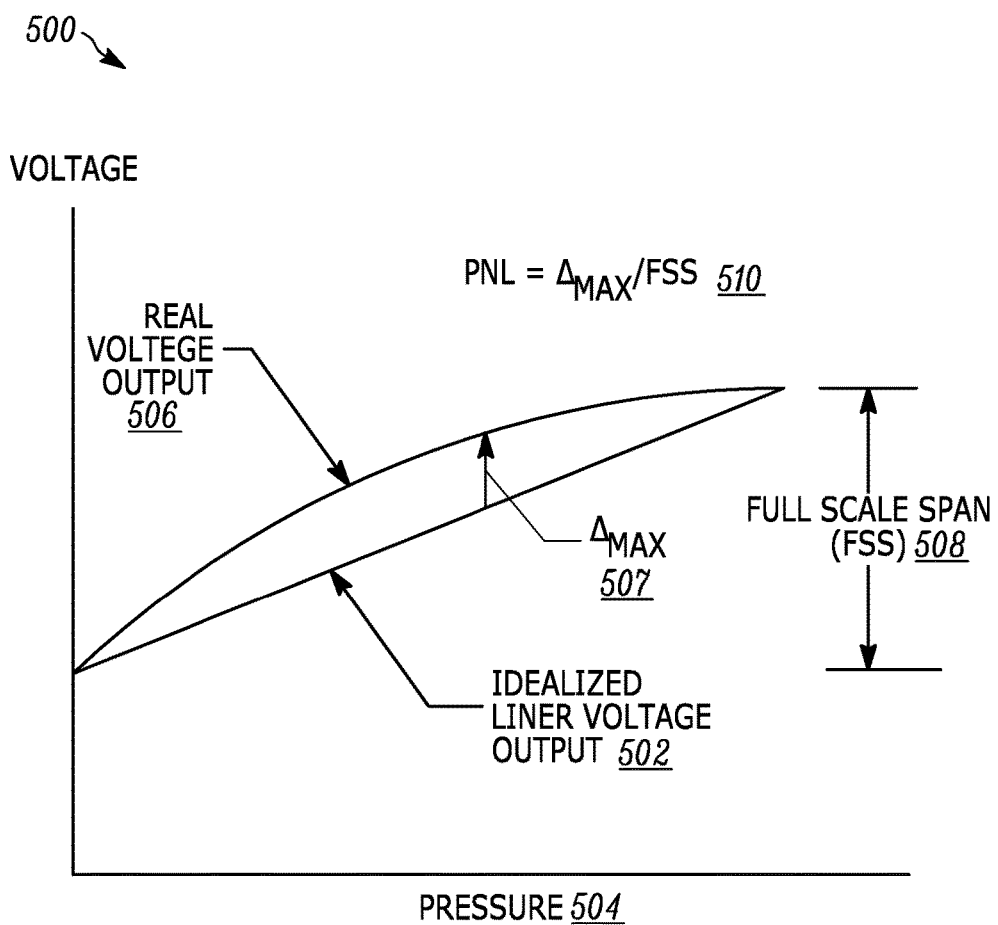
FIG. 5 is a graph depicting an idealized linear output voltage as a function of input voltage and applied pressure and also depicting pressure nonlinearity and the sensitivity of a MEMS pressure sensing device.

FIG. 5 is a graph 500 depicting an idealized, linear output voltage 502 as a function of input pressure 504 to a MEMS pressure sensing device. FIG. 5 also depicts a representation of an actual output voltage 506 as a function of input pressure 504. As can be seen in FIG. 5, the actual output voltage 506 from a MEMS pressure is not linear. A full scale span (FSS) 508 is the voltage difference between the two voltage outputs V1 and V2 sensed at the lowest pressure P1 and the highest pressure P2. The deviation 507 is the value obtained by subtracting an idealized linear voltage output 502 from a real output voltage 506 at a pressure level in the pressure range from P1 to P2. The maximum deviation in the pressure range is defined as Δmax 507. A pressure nonlinearity or PNL 510 is defined by the Δmax 507 divided by the FSS 508. The PNL of the MEMS pressure sensing device is usually expressed as percentages of the full scale span. PNL 510 is well known to increase as the diaphragm deflection increases.

The sensitivity of the MEMS pressure sensing device is represented by the full scale voltage span 508, which those of ordinary skill in the art should recognize the difference in the output voltage V1 and V2 across a pressure range P1-P2.

Figure 6:
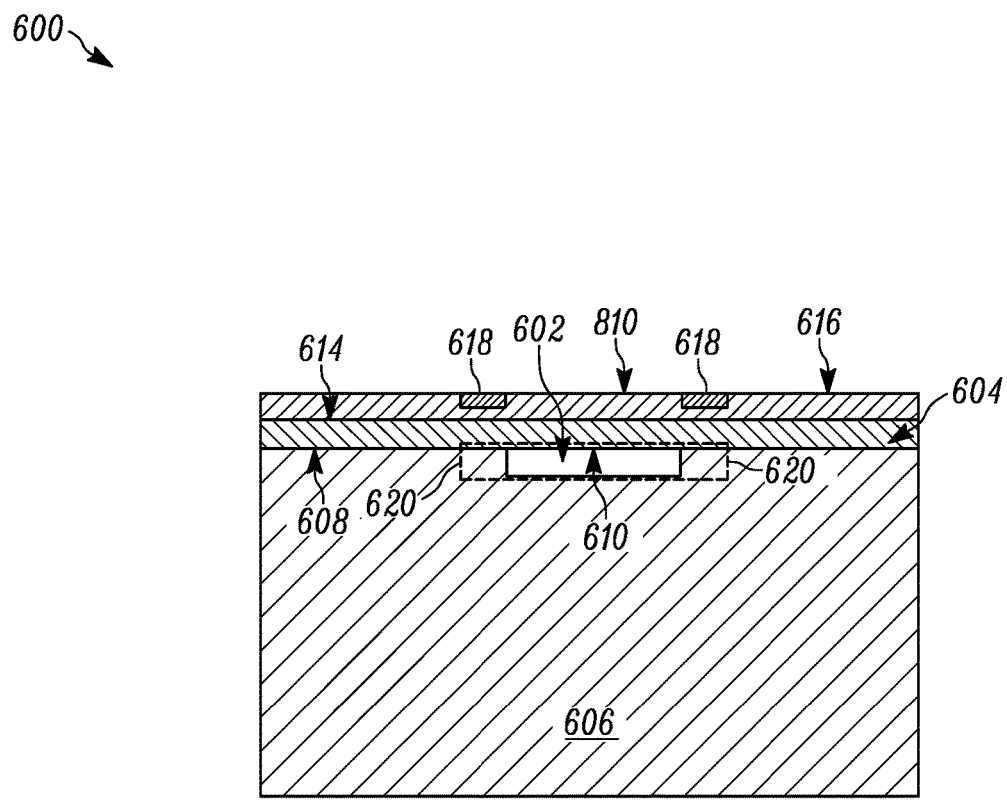
FIG. 6 is a cross-sectional diagram of a cavity silicon on insulator (CSOI) MEMS pressure sensing device.

Referring now to FIG. 6, a, "cavity silicon on insulator" (CSOI) MEMS pressure sensing device 600 is shown in cross section. The CSOI MEMS pressure sensing device 600 comprises an "extended shallow polygon cavity" identified by reference numeral 602, which is formed in a "top" side 604 of a supporting substrate 606 that is made of single crystalline silicon.

The top side 604 of the silicon supporting substrate 606 is fusion-bonded to a "bottom" side 608 of a thin, silicon dioxide layer 610, which is referred to herein as being "buried."

The buried silicon dioxide layer 610 has two opposing surfaces or sides, referred to herein arbitrarily as top and bottom surfaces or sides. The bottom "side" 608 is fusion-bonded to the top side 604 of the silicon supporting substrate 606.

The top side 614 of the "buried" silicon dioxide layer 610 is attached to a thin silicon "device layer" 616 by fusion bonding. The device layer 616 is so called because it is selectively doped in localized regions to form piezoresistors 618. The piezoresistors, which are connected in a Wheatstone bridge topology, are preferably located near the outer edges 620 of the extended shallow-polygon cavity 602 where deflection of the device layer 616 by an applied pressure will maximize deformation of the piezoresistors 618 and thus cause the greatest change in the voltage output from the Wheatstone bridge circuit formed.

Figure 7A:
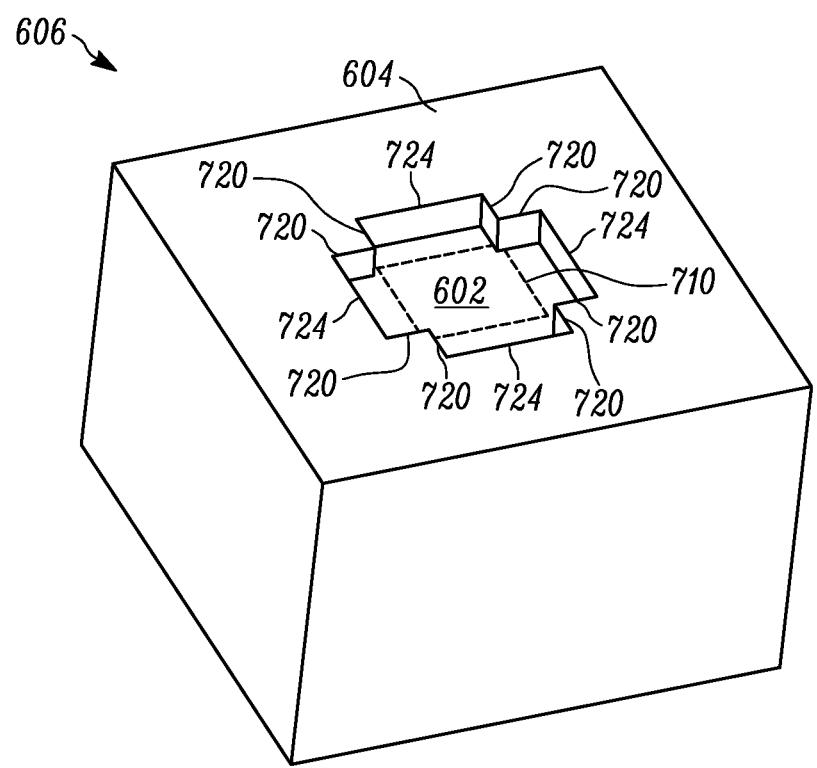
FIG. 7A is a perspective view of a silicon supporting substrate, which is the bottom substrate of the CSOI MEMS pressure sensing device shown in FIG. 6 and which has an extended shallow polygon cavity on its top side.

FIG. 7A is a perspective view of the silicon supporting substrate 606. An "X" or cross-shaped recess 602 can be seen in the top side 604. That recess 602 is considered herein to be an "extended shallow polygon cavity" 602 because it is relatively shallow, as measured from the top side 604, and because it includes recess "extensions" that extend away from a substantially square-shaped "center" recess.

The cavity 602 has a depth 622, best seen in FIG. 6, measured from the top side 604 of the substrate 606 downwardly to the substantially flat bottom 710 of the cavity 602. The cavity depth 622 is preferably between about 5 microns and about 30 microns. The cavity 602 is thus relatively shallow, at least when compared to 400 micron or deeper cavities used in prior art MEMS pressure sensing devices.

The "buried" silicon dioxide layer 610, as shown in FIG. 6, electrically separates the supporting substrate 606 from the device layer 616 but it will also act as a stiffener to the device layer 616 because it is attached to the device layer 616. The silicon dioxide layer 610 is therefore preferably thin, i.e., preferably between about 0.1 microns up to about 2.0 microns. In order to maximize deflection and thus sensitivity, the device layer, 616 is also thin, having a thickness between about 2.0 microns up to about 5.0 microns.

Figure 7B:
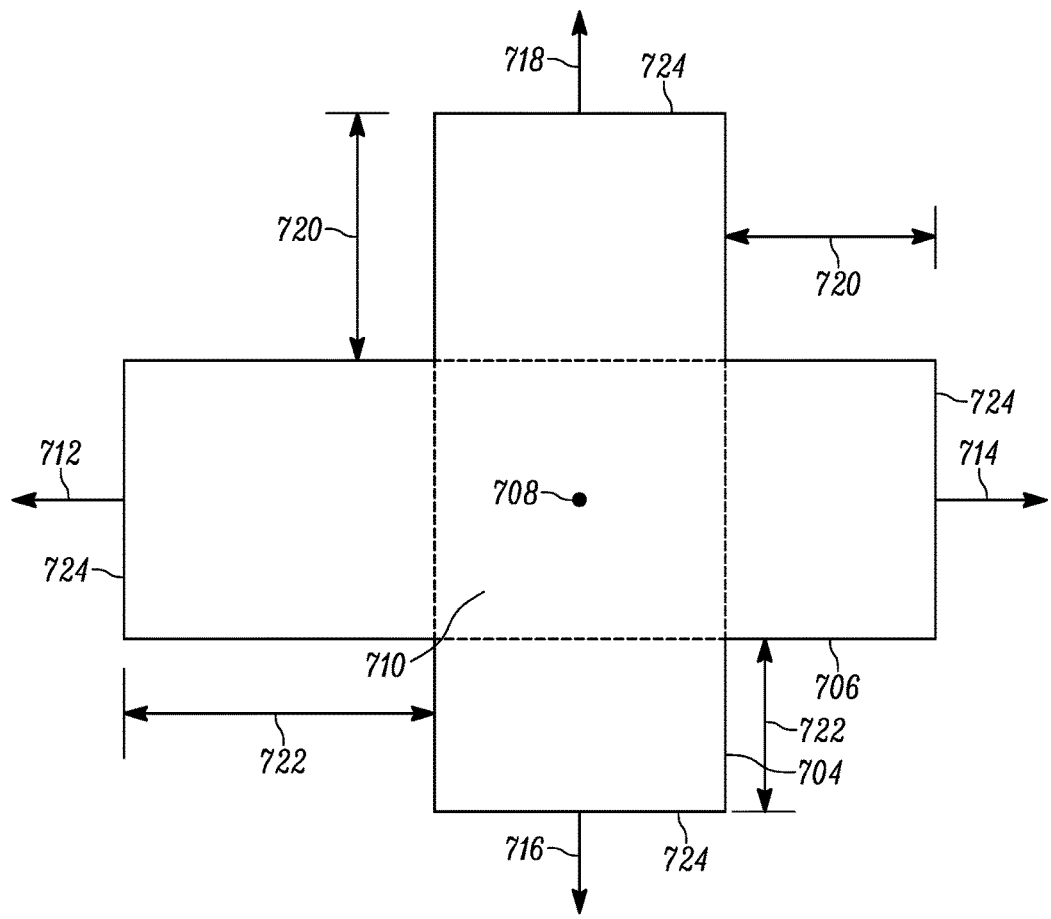
FIG. 7B depicts two, rectangular-shaped recesses that "intersect" to form an extended polygonal recess.

Referring to FIG. 7B, the extended shallow polygon cavity 602 is preferably formed using deep reactive-ion etching (DRIE) because DRIE is able to produce nearly vertical sidewalls and the etch rate is faster than that of reactive-ion etching (RIE). Wet etching such as potassium hydroxide (KOH) etching can also be used although the cavity walls will be somewhat sloped but does not otherwise increase the die size much because the cavity is shallow. The cavity 602 is considered herein as having a shape substantially the same as two, substantially rectangular cavities 704 and 706 with substantially the same depth, which "cross" or intersect each other at or near their midpoints 708. The crossed rectangular cavities thus define a shape substantially the same as (reminiscent of) the Arabic letter "X" or a cross (+). The cavity 602 is also considered herein to be a "polygonal" cavity because its shape is a polygon, well known as a closed plane figure bounded by straight lines. The polygonal cavity 602 shown and claimed herein has a shape unlike the shapes of cavities or recesses used in prior art MEMS pressure sensing devices.

The "intersection" of two, rectangular cavities 704, 706 defines a substantially square-shaped centrally-located common portion 710. The different rectangular-shaped cavities 704 and 706 are also considered as extending away from the square portion 710 by short distances and in opposite directions 712, 714 and 716 and 718. The extensions of the rectangular-shaped cavities past the square-shaped common portion 710 is predetermined and identified by reference numeral 720 and 722. The distances 720 and 722 by which the rectangular-shaped cavities extend beyond or past the square portion 710 is considered herein to be an "extension" of the rectangular-shaped cavities beyond the square-shaped common portion 710. If the extensions 720 and 722 are the same, the cross is symmetric. If not, the cross is asymmetric. The extensions 720 and 722 have edges 724 that define the terminus of the extended shallow polygon cavity 602.

Figure 8:
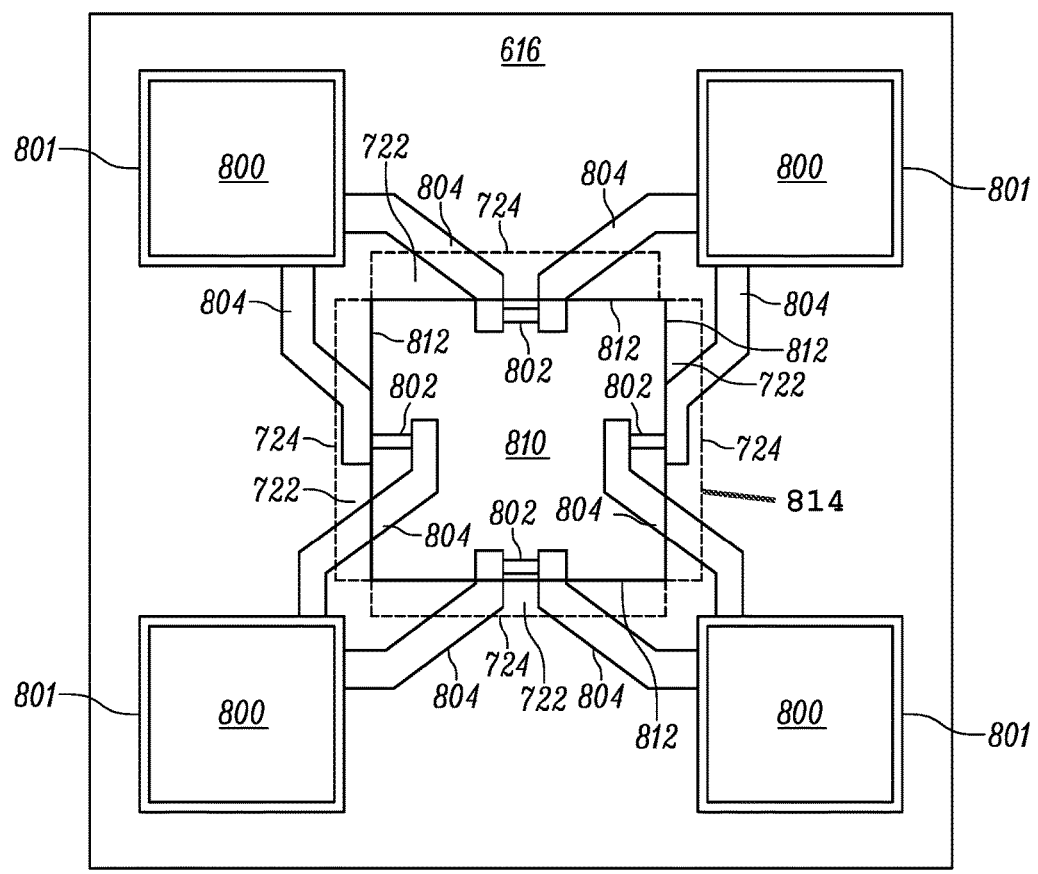
FIG. 8 is a top view of a "device layer" of the CSOI MEMS pressure sensing device shown in FIG. 6, showing locations of bond pads and piezoresistors connected to the bond pads by conductive traces, formed by doped regions on the device layer.

FIG. 8 depicts a top view of the device layer 616. The device layer 616 comprises four bond pads 800 formed by opening interlevel dielectric layers (IDL) and passivation layers and depositing metal such as aluminum onto the localized doped conductive areas 801 of the device layer 616. Each bond pad 800 of the four bond pads 800 is located at a corner of four, diagonally-opposite corners of the device layer 616, best seen in FIG. 6. Each bond pad 800 is also located at diagonally-opposite corner of the rectangular-shaped center recess 602, best seen in FIG. 6 and FIG. 7A. The conductive bond pads 800 are electrically connected to piezoresistors 802 by way of conductive traces 804, and conductive areas 801 below the bond pads 800. Both the piezoresistors and the conductive areas 801 and conductive traces 804 are formed by doping the top surface of the device layer 616 using processes well known to those of ordinary skill in the art.

In FIG. 8, the dashed line identified by reference numeral 814 is an outline of the extended shallow polygon cavity 602 located on the top side of the supporting substrate 606 and lying below the device layer 616. The square or substantially square-shaped line identified by reference numeral 812 depicts boundaries of the substantially square-shaped common portion of the cavity 602.

Piezoresistors 802 formed in the device layer 616 are located in the device layer 616 above the extensions 722 of the cavity 602. They are preferably located near the edges 724 of the extensions for highest sensitivity.

A diaphragm 810 over the extended shallow polygon cavity 602 is defined by the portion of the device layer 616 located directly above the cavity 602. The diaphragm 810 is thus also identified by the broken or dashed line identified by reference numeral 814.

Figure 9:
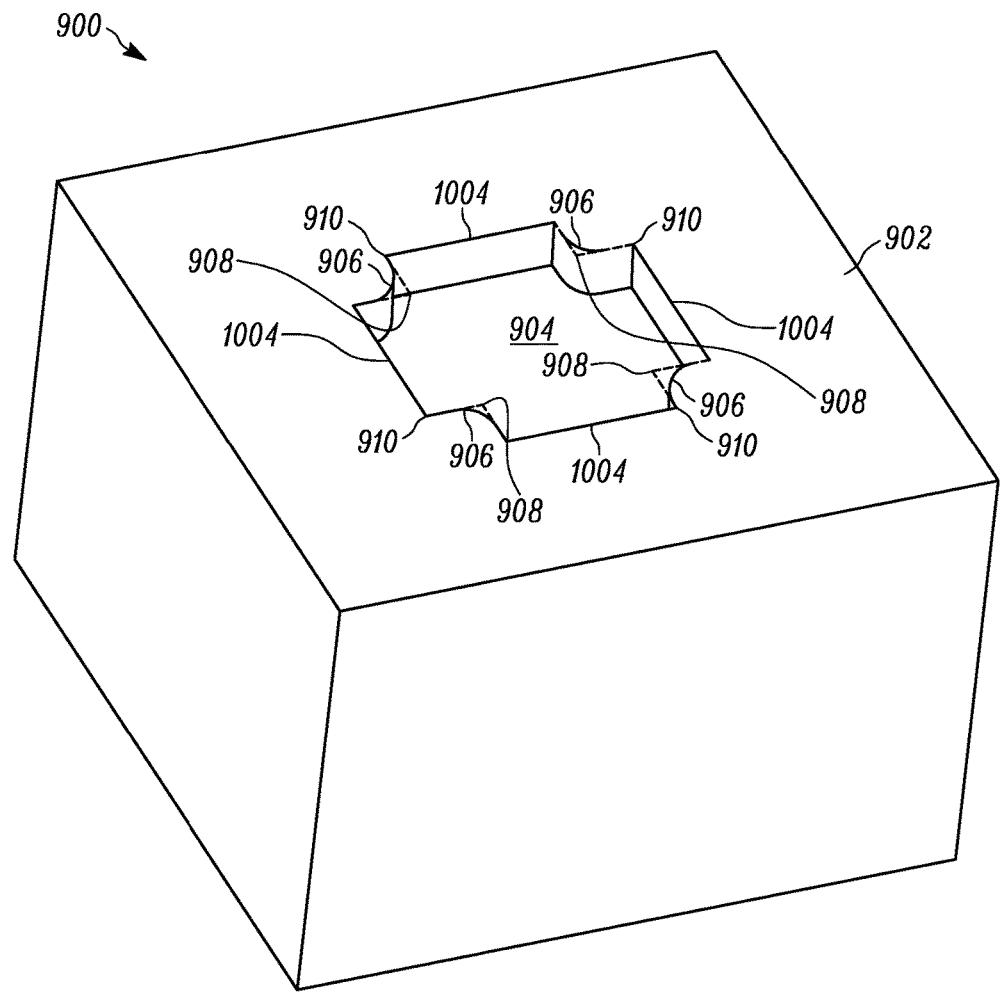
FIG. 9 is a perspective view of an alternate embodiment of a silicon supporting substrate having an extended shallow polygon cavity, corners of which are provided with a radius.

FIG. 9 depicts an alternate embodiment of a silicon supporting substrate 900. Its top surface 902 is provided with an extended shallow polygon cavity 904 which differs from the supporting substrate shown in FIG. 7A by the formation of concave radii 906 where the adjacent corners 908 of the crossed rectangular cavities would be located.

Figure 10:
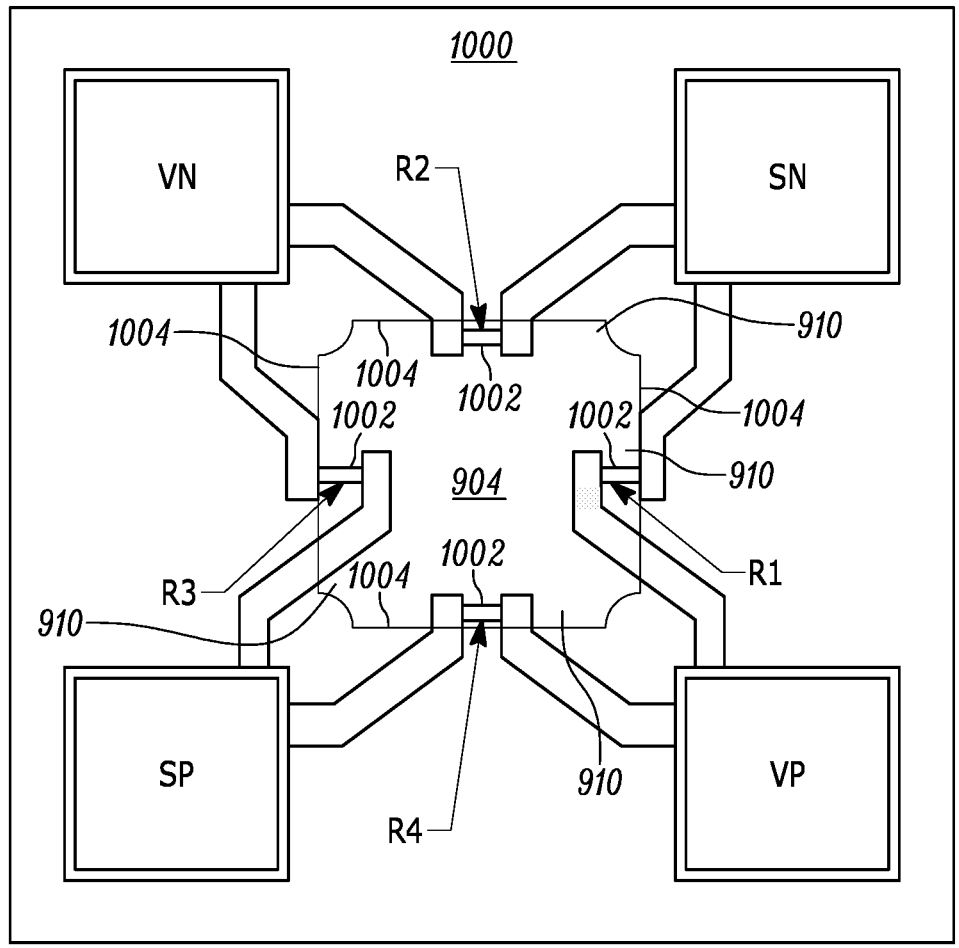
FIG. 10 is a top view of an alternate embodiment of a device layer, configured to be used with the alternate embodiment of the silicon supporting layer shown in FIG. 9.

FIG. 10 shows a top view of the device layer 1000 formed above the supporting substrate 900 shown in FIG. 9. As with the device layer shown in FIG. 8, piezoresistors 1002 are formed near the edges 1004 of the extensions 910 of the cavity 904. Computer modeling of the CSOI MEMS pressure sensing device formed using the substrate shown in FIG. 9 showed that the span voltage increased from about 87 millivolts up to about 93 millivolts. The alternate embodiment shown in FIG. 9 and FIG. 10 thus has a slightly improved maximum span voltage.

Figure 11:
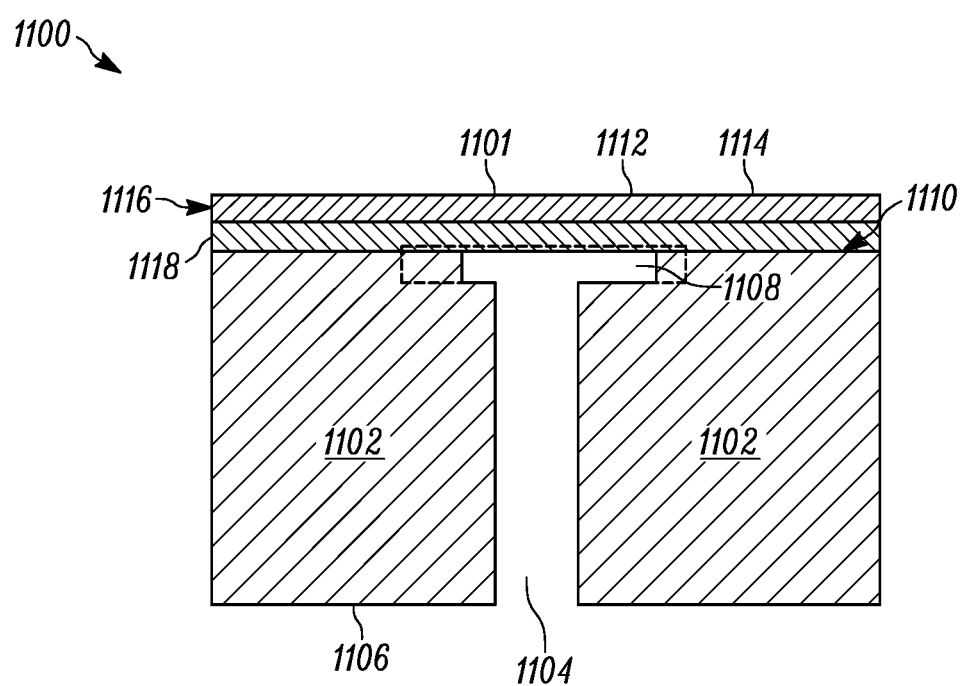
FIG. 11 is a cross-sectional view of a CSOI MEMS pressure sensing device having a through-hole that extends through the silicon supporting substrate to the inside of the extended shallow polygon cavity.

FIG. 11 shows a cross-sectional diagram 1101 of a CSOI MEMS pressure sensing device 1100, which is configured to sense pressure differentials. The diaphragm 1101 consists of the portion of a device layer 1116 and a buried silicon dioxide layer, which are above an extended shallow polygon cavity 1108. The device layer 1116 and the buried silicon dioxide layer are located on a top surface 1110 of a supporting substrate 1102.

The substrate layer 1102 is provided with a through-hole 1104 that extends from the bottom 1106 of the supporting substrate 1102 to the extended shallow polygon cavity 1108 formed into the supporting substrate top surface 1110. The through-hole 1104 allows a fluid (liquid or gas) to apply pressure to the "back" side or bottom of the diaphragm. A piezoresistive Wheatstone bridge circuit 1112 formed in the top surface 1114 of the device layer 1116 will produce an output voltage that is proportional to the difference in pressures applied to the top side and the bottom side of the diaphragm 1101.

Figure 12:
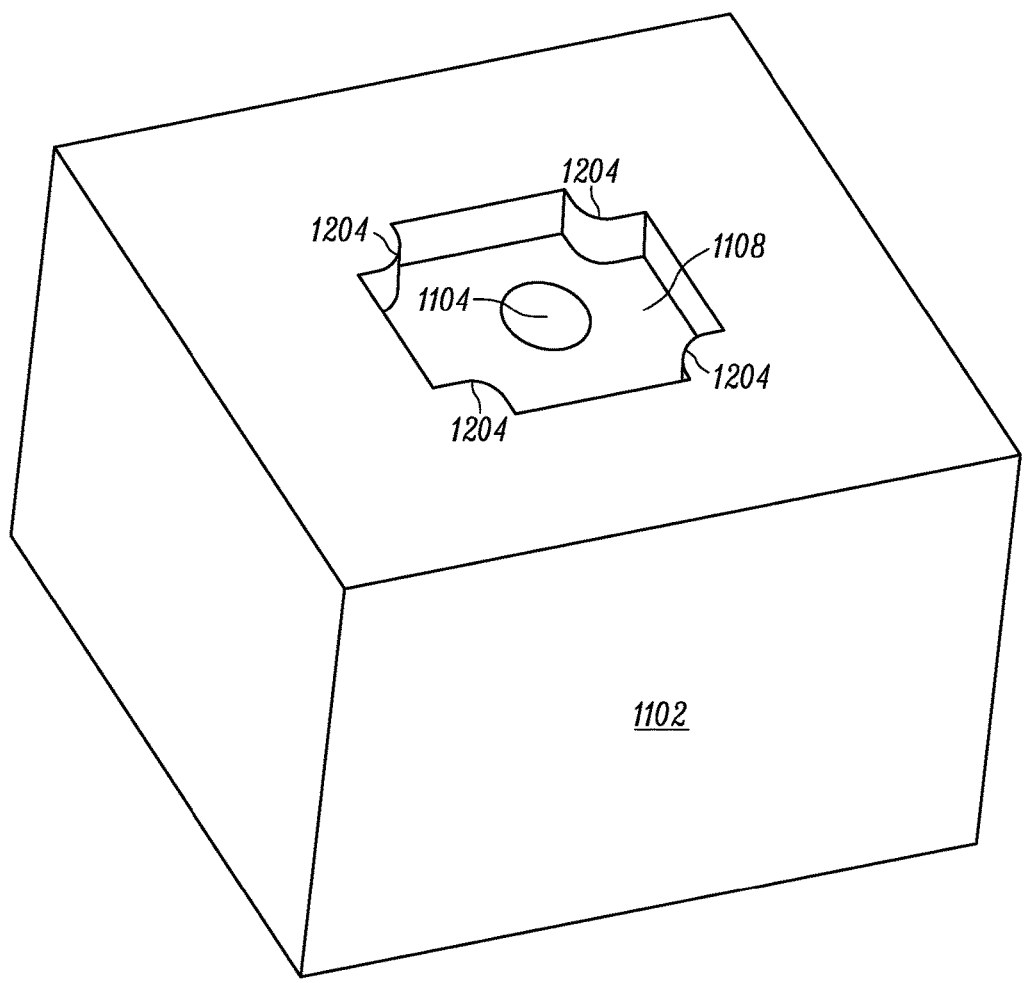
FIG. 12 is a perspective view of the silicon supporting substrate, the cross section of which is shown in FIG. 11.

FIG. 12 is a perspective view of the supporting substrate 1102 that is the bottom substrate of the CSOI MEMS pressure sensing device 1100 and which defines the size and shape of the diaphragm 1101 shown in FIG. 11. An extended shallow polygon cavity 1108 has concave radii 1204 near the corners of where two rectangular-shaped cavities would intersect each other. The through-hole 1104 extends from the bottom surface 1106 into the cavity 1108.

Figure 13:
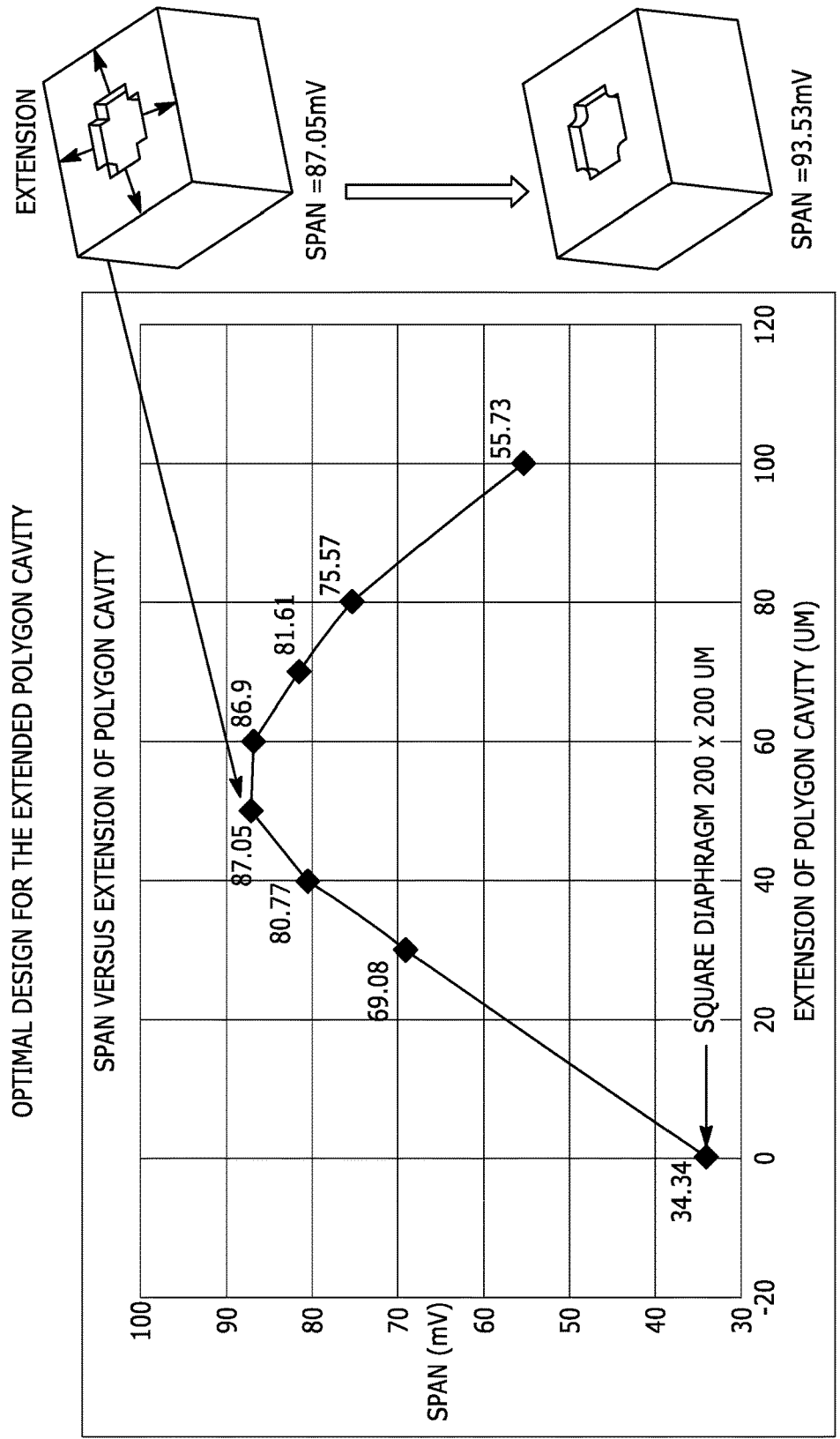
FIG. 13 is a graph depicting output voltage span from the Wheatstone bridge formed in the device layer as a function of the polygon cavity extension.

Referring now to FIG. 13, the dimensions of the extensions of the rectangular-shaped cavities can be optimized to produce a maximum span output voltage. Expansion of the rectangular cavities as described above is considered to be the distance beyond the common portion. Computer modeling showed that the extension of the cavities by about 50 microns from a square diaphragm 200×200 um maximized the output span voltage at about 87 millivolts. Further extension does not increase the span but reduce the span with more constrained on the narrow expansion area. The corner rounding further slightly improves the span by about 7% to about 94 millivolts.

Figure 14:
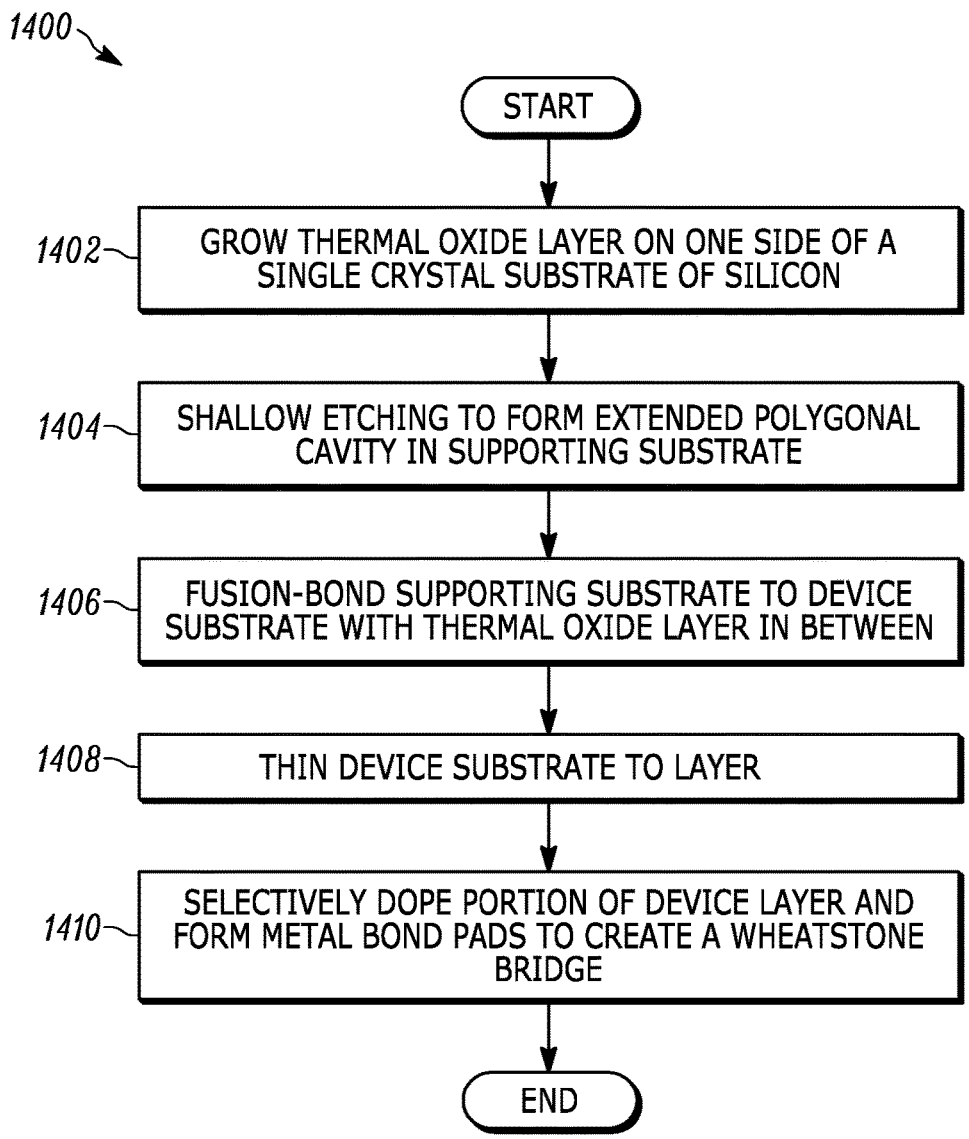
FIG. 14 depicts steps of a method.

As shown in FIG. 14, a method of forming the CSOI MEMS pressure sensing devices described above and shown in the figures includes growing a thermal oxide layer on one side of a silicon device substrate 1402. A silicon supporting substrate is etched in step 1404, preferably by reactive ion etching because DRIE forms a cavity, the sidewalls of which are relatively vertical or straight and the etch rate is faster than RIE.

After the silicon supporting substrate is etched to form an extended shallow polygon cavity, the supporting substrate is fusion-bonded at step 1406 to the silicon device substrate with the thermal oxide layer in between. The thermal oxide layer is thus considered to be "buried" between the supporting substrate and the silicon device substrate on which the oxide layer was grown.

After the silicon device substrate and the buried oxide layer are bonded to the supporting substrate, the device substrate is etched or thinned to a thin layer at step 1408, after which piezoresistors, conductive areas, conductive traces, bond pads are formed at step 1410 on the top surface of the device layer.

The foregoing description is for purposes of illustration only. The true scope of the invention is set forth in the following claims.

What is claimed is:

1. A cavity silicon on insulator (CSOI) microelectromechanical system (MEMS) pressure sensing device comprising:

a substantially cross-shaped recess formed into a second side of a silicon supporting substrate having a first side opposite to the second side, and a the substantially cross-shaped recess having a substantially planar bottom surface, the substantially cross-shaped recess comprising four, substantially rectangular recesses in the second side, each of which extends away from a substantially rectangular-shaped center recess in the second side;

a substantially planar, buried silicon dioxide layer having a first side opposite to a second side, the first side of the substantially planar buried silicon dioxide layer being attached to the second side of the silicon supporting substrate and extending over the substantially cross-shaped recess;

a substantially planar device layer having a first side opposite to a second side, the first side of the substantially planar device layer being located on top of the second side of the substantially planar buried silicon dioxide layer, the device layer comprising a diaphragm, which is located above the substantially cross-shaped recess; the diaphragm having a shape substantially the same as a shape of the substantially cross-shaped recess and having dimensions which are substantially equal to dimensions of the substantially cross-shaped recess;

at least four bond pads formed and located on the second side of the device layer, each bond pad of the at least four bond pads being located at a corner of four, diagonally-opposite corners of the device layer, bond pads of the at least four bond pads at the diagonally-opposite corners being located at diagonally-opposite corners of the rectangular-shaped center recess, and the at least four bond pads have keep-out distances from the substantially cross-shaped recess; and the substantially cross-shaped recess is configured to increase pressure sensitivity while decreasing pressure nonlinearity.

2. The CSOI MEMS pressure sensing device of claim 1, wherein the substantially rectangular-shaped center recess is a substantially square-shaped center recess measuring about 200 microns by about 200 microns and the four, substantially rectangular recesses extend away from the substantially square-shaped center recess by a distance between about 40 microns up to about 70 microns, widths of the four, substantially rectangular recesses being about 200 microns, depth of each of the four, substantially rectangular recesses being substantially the same and being measured from the second side of the silicon supporting substrate, and is between about five microns up to about thirty microns.

3. The CSOI MEMS pressure sensing device of claim 1, wherein the buried silicon dioxide layer has a thickness of about 0.1 to about 2.0 microns.

4. The CSOS MEMS pressure sensing device of claim 1, wherein the device layer has a thickness of about 2.0 microns up to about 5.0 microns.

5. The CSOI MEMS pressure sensing device of claim 1, wherein the substantially cross-shaped recess comprises two, substantially rectangular-shaped cavities formed into the second surface of the supporting substrate and which are substantially orthogonal to each other, and which extend away from a substantially square-shaped center recess, the two, substantially rectangular-shaped cavities have substantially a same depth.

6. The CSOI MEM pressure sensing device of claim 1, wherein the diaphragm comprises piezoresistors, which are located in the diaphragm and are above the four, substantially rectangular recesses of the substantially cross-shaped recess.

7. The CSOI MEMS pressure sensing device of claim 6, wherein the piezoresistors are located in the diaphragm, above edges of the substantially cross-shaped recess.

8. The CSOI MEMS pressure sensing device of claim 5, wherein material of the silicon supporting substrate between adjacent corners of the two, substantially rectangular-shaped cavities is removed to form concave radii, the concave radii extending into the substantially cross-shaped recess.

9. The CSOI MEMS pressure sensing device of claim 5, wherein the two, substantially rectangular-shaped cavities are asymmetric.

10. The CSOI MEMS pressure sensing device of claim 5, wherein the substantially square-shaped center recess has length and width dimensions substantially equal to about 200 microns to have an output voltage span of about 34.34 millivolts, wherein:

each of the four, substantially rectangular recesses extends outward about 40 microns from the substantially square-shaped center recess, to have an output voltage span of about 80.77 millivolts;

each of the four, substantially rectangular recesses is extended outward about 70 microns from the substantially square-shaped center recess, to have an output voltage span of about 81.66 millivolts; and each of the four, substantially rectangular recesses is extended outward from the substantially square-shaped center recess about 50 microns, to have an output voltage span of about 87.05 millivolts.

11. The CSOI MEMS pressure sensing device of claim 10, wherein each of the four, substantially rectangular recesses is extended outward from the substantially square-shaped center recess about 50 microns and are sized and shaped to form rounded corners between each of the four, substantially rectangular recesses that extend away from the substantially square-shaped center recess.

12. The CSOI MEMS pressure sensing device of claim 1, wherein each of the four, substantially rectangular recesses is contiguous with and extending away from the substantially rectangular-shaped center recess.

13. The CSOI MEMS pressure sensing device of claim 1, wherein the silicon supporting substrate additionally comprises a through hole, which extends through the silicon supporting substrate from the first side of the silicon supporting substrate to the substantially cross-shaped recess.

* * * * *